(12) United States Patent
Pervan et al.

(10) Patent No.: US 10,344,379 B2
(45) Date of Patent: *Jul. 9, 2019

(54) POWDER OVERLAY

(71) Applicant: Valinge Innovation AB, Viken (SE)

(72) Inventors: Darko Pervan, Viken (SE); Goran Ziegler, Viken (SE)

(73) Assignee: VALINGE INNOVATION AB, Viken (SE)

( * ) Notice: Subject to any disclaimer, the term of this patent is extended or adjusted under 35 U.S.C. 154(b) by 408 days.

This patent is subject to a terminal disclaimer.

(21) Appl. No.: 15/061,303

(22) Filed: Mar. 4, 2016

(65) Prior Publication Data

US 2016/0186318 A1    Jun. 30, 2016

Related U.S. Application Data

(63) Continuation of application No. 13/912,587, filed on Jun. 7, 2013, now Pat. No. 9,296,191, which is a
(Continued)

(51) Int. Cl.
*B44C 5/04* (2006.01)
*C23C 16/44* (2006.01)
(Continued)

(52) U.S. Cl.
CPC ............ *C23C 16/44* (2013.01); *B05D 5/02* (2013.01); *B05D 5/06* (2013.01); *B05D 7/06* (2013.01);
(Continued)

(58) Field of Classification Search
CPC .. B05D 2401/32; B44C 5/0492; B44C 5/0476
(Continued)

(56) References Cited

U.S. PATENT DOCUMENTS 2,231,953 A    2/1941 Ruzicka
2,587,064 A    2/1952 Rapson
(Continued)

FOREIGN PATENT DOCUMENTS

AU    80284/75    6/1975
CA    2 406 991 A1    10/2002
(Continued)

OTHER PUBLICATIONS

U.S. Appl. No. 15/704,634, filed Sep. 14, 2017, Darko Pervan, Kent Lindgren, Jan Jacobsson, Eddy Boucké, Göran Ziegler and Niclas Håkansson, (cited herein as US Patent Application Publication No. 2018/0002934 A1 of Jan. 4, 2018).
(Continued)

*Primary Examiner* — Scott W Dodds
(74) *Attorney, Agent, or Firm* — Buchanan Ingersoll & Rooney P.C.

(57) ABSTRACT

A method is disclosed of manufacturing a transparent wear resistant surface layer (1). The method may include the steps of, applying a decorative material on a carrier, applying a dry powder layer comprising a mix of processed wood fibers, binder and wear resistant particles above the decorative layer, curing the mix to a decorative surface, including the transparent wear resistant layer, by applying heat and pressure on the mix. In a preferred embodiment the method includes the step of pressing the mix against an embossed matrix to create an embossed decorative surface with high wear resistance.

15 Claims, 1 Drawing Sheet

Related U.S. Application Data continuation of application No. 13/084,955, filed on Apr. 12, 2011, now Pat. No. 8,480,841.

(60) Provisional application No. 61/323,463, filed on Apr. 13, 2010.

(51) Int. Cl.

| | | |
|---|---|---|
| *B05D 5/02* | (2006.01) | |
| *B05D 5/06* | (2006.01) | |
| *B05D 7/06* | (2006.01) | |
| *B32B 38/00* | (2006.01) | |
| B32B 38/06 | (2006.01) | |
| B32B 37/24 | (2006.01) | |
| B05D 3/12 | (2006.01) | |

(52) U.S. Cl.
CPC ........ *B32B 38/0036* (2013.01); *B44C 5/0476* (2013.01); *B05D 3/12* (2013.01); *B05D 2401/32* (2013.01); *B32B 38/06* (2013.01); *B32B 38/145* (2013.01); *B32B 2037/243* (2013.01); *B32B 2305/30* (2013.01); *B32B 2307/554* (2013.01); *B32B 2309/02* (2013.01); *B32B 2309/12* (2013.01); *B32B 2317/02* (2013.01); *B32B 2317/125* (2013.01); *B32B 2317/16* (2013.01); *B32B 2471/00* (2013.01); *B44C 5/0492* (2013.01); *Y10T 156/1041* (2015.01)

(58) Field of Classification Search
USPC .................................. 427/189–195
See application file for complete search history.

(56) References Cited

U.S. PATENT DOCUMENTS

| | | | |
|---|---|---|---|
| 2,831,793 A | 4/1958 | Elmendorf | |
| 2,861,372 A | 11/1958 | Hunt | |
| 2,962,081 A | 11/1960 | Dobry et al. | |
| 3,032,820 A | 5/1962 | Johnson | |
| 3,135,643 A | 6/1964 | Michl | |
| 3,164,648 A | 1/1965 | Franksson | |
| 3,286,006 A | 11/1966 | Annand | |
| 3,308,013 A | 3/1967 | Bryant | |
| 3,325,302 A | 6/1967 | Hosfeld | |
| 3,342,621 A | 9/1967 | Point et al. | |
| 3,345,234 A | 10/1967 | Jecker et al. | |
| 3,373,070 A | 3/1968 | Fuerst | |
| 3,426,730 A | 2/1969 | Lawson et al. | |
| 3,463,653 A | 8/1969 | Letter | |
| 3,486,484 A | 12/1969 | Bullough | |
| 3,533,725 A | 10/1970 | Bridgeford | |
| 3,540,978 A | 11/1970 | Ames | |
| 3,565,665 A | 2/1971 | Stranch et al. | |
| 3,647,500 A | 3/1972 | Mizuno | |
| 3,673,020 A | 6/1972 | De Jaeger | |
| 3,674,619 A | 7/1972 | Scher | |
| 3,793,125 A | 2/1974 | Kunz | |
| 3,846,219 A | 11/1974 | Kunz | |
| 3,880,687 A | 4/1975 | Elmendorf et al. | |
| 3,887,678 A | 6/1975 | Lewicki, Jr. | |
| 3,897,185 A | 7/1975 | Beyer | |
| 3,897,588 A | 7/1975 | Nohtomi | |
| 3,914,359 A | 10/1975 | Bevan | |
| 3,961,108 A | 6/1976 | Rosner et al. | |
| 4,052,739 A | 10/1977 | Wada et al. | |
| 4,093,766 A | 6/1978 | Scher et al. | |
| 4,131,705 A | 12/1978 | Kubinsky | |
| 4,255,480 A | 3/1981 | Scher | |
| 4,256,793 A | 3/1981 | Cannady, Jr. et al. | |
| 4,313,857 A | 2/1982 | Blount | |
| 4,337,290 A | 6/1982 | Kelly et al. | |
| 4,376,147 A | 3/1983 | Byrne et al. | |
| 4,400,705 A | 8/1983 | Horike | |
| 4,420,525 A | 12/1983 | Parks | |
| 4,430,375 A | 2/1984 | Scher et al. | |
| 4,450,194 A | 5/1984 | Kauffman et al. | |
| 4,474,920 A | 10/1984 | Kyminas et al. | |
| 4,615,090 A | 10/1986 | Baus | |
| 4,756,856 A | 7/1988 | Choinski | |
| 4,890,656 A | 1/1990 | Ohsumi et al. | |
| 5,034,272 A | 7/1991 | Lindgren et al. | |
| 5,112,671 A | 5/1992 | Diamond | |
| 5,134,026 A | 7/1992 | Melcher | |
| 5,188,876 A | 2/1993 | Hensel et al. | |
| 5,206,066 A | 4/1993 | Horacek | |
| 5,246,765 A | 9/1993 | Lussi et al. | |
| 5,258,216 A | 11/1993 | Von Bonin et al. | |
| 5,266,384 A | 11/1993 | O'Dell | |
| 5,314,554 A | 5/1994 | Owens | |
| 5,405,681 A | 4/1995 | Nakayama et al. | |
| 5,422,170 A | 6/1995 | Iwata et al. | |
| 5,466,511 A | 11/1995 | O'Dell et al. | |
| 5,543,193 A | 8/1996 | Tesch | |
| 5,547,741 A | 8/1996 | Wilson | |
| 5,569,424 A | 10/1996 | Amour | |
| 5,601,930 A | 2/1997 | Mehta et al. | |
| 5,604,025 A | 2/1997 | Tesch | |
| 5,609,966 A | 3/1997 | Perrin et al. | |
| 5,670,237 A * | 9/1997 | Shultz | B29C 43/222 427/198 |
| 5,766,522 A | 6/1998 | Daly et al. | |
| 5,787,655 A | 8/1998 | Saylor, Jr. | |
| 5,827,788 A | 10/1998 | Miyakoshi | |
| 5,855,832 A | 1/1999 | Clausi | |
| 5,865,003 A | 2/1999 | Klett | |
| 5,891,564 A | 4/1999 | Schultz et al. | |
| 5,925,296 A | 7/1999 | Leese | |
| 5,942,072 A | 8/1999 | McKinnon | |
| 6,013,222 A | 1/2000 | Douglas et al. | |
| 6,036,137 A | 3/2000 | Myren | |
| 6,103,377 A | 8/2000 | Clausi | |
| 6,218,001 B1 | 4/2001 | Chen | |
| 6,238,750 B1 | 5/2001 | Correll et al. | |
| 6,423,167 B1 | 7/2002 | Palmer et al. | |
| 6,444,075 B1 | 9/2002 | Schneider et al. | |
| 6,468,645 B1 | 10/2002 | Clausi | |
| 6,521,326 B1 | 2/2003 | Fischer et al. | |
| 6,537,610 B1 | 3/2003 | Springer et al. | |
| 6,579,610 B1 | 6/2003 | Shortland | |
| 6,617,009 B1 | 9/2003 | Chen et al. | |
| 6,620,349 B1 | 9/2003 | Lopez | |
| 6,652,695 B1 | 11/2003 | Von Der Heide et al. | |
| 6,666,951 B1 | 12/2003 | Kostiw | |
| 6,675,545 B2 | 1/2004 | Chen et al. | |
| 6,761,008 B2 | 7/2004 | Chen et al. | |
| 6,769,217 B2 | 8/2004 | Nelson | |
| 6,773,799 B1 | 8/2004 | Persson et al. | |
| 6,803,110 B2 | 10/2004 | Drees et al. | |
| 6,926,954 B2 | 8/2005 | Schuren et al. | |
| 6,986,934 B2 | 1/2006 | Chen et al. | |
| 6,991,830 B1 | 1/2006 | Hansson et al. | |
| 7,022,756 B2 | 4/2006 | Singer | |
| 7,169,460 B1 | 1/2007 | Chen et al. | |
| 7,211,310 B2 | 5/2007 | Chen et al. | |
| 7,276,265 B2 | 10/2007 | Sigel et al. | |
| 7,419,717 B2 | 9/2008 | Chen et al. | |
| 7,485,693 B2 | 2/2009 | Matsuda et al. | |
| 7,568,322 B2 | 8/2009 | Pervan et al. | |
| 7,576,140 B2 | 8/2009 | Tamaki et al. | |
| 7,584,583 B2 | 9/2009 | Bergelin et al. | |
| 7,763,345 B2 | 7/2010 | Chen et al. | |
| 7,802,415 B2 | 9/2010 | Pervan | |
| 7,811,489 B2 | 10/2010 | Pervan | |
| 7,816,000 B2 | 10/2010 | Sparks et al. | |
| 7,886,497 B2 | 2/2011 | Pervan et al. | |
| 7,930,862 B2 | 4/2011 | Bergelin et al. | |
| 8,021,741 B2 | 9/2011 | Chen et al. | |
| 8,028,486 B2 | 10/2011 | Pervan | |
| 8,043,661 B2 | 10/2011 | Linnemann | |
| 8,112,891 B2 | 2/2012 | Pervan | |
| 8,245,478 B2 | 8/2012 | Bergelin et al. | |

(56) References Cited

U.S. PATENT DOCUMENTS

| | | |
|---|---|---|
| 8,293,058 B2 | 10/2012 | Pervan et al. |
| 8,349,234 B2 | 1/2013 | Ziegler et al. |
| 8,349,235 B2 | 1/2013 | Pervan et al. |
| 8,365,499 B2 | 2/2013 | Nilsson et al. |
| 8,419,877 B2 | 4/2013 | Pervan et al. |
| 8,431,054 B2 | 4/2013 | Pervan et al. |
| 8,480,841 B2 | 7/2013 | Pervan et al. |
| 8,481,111 B2 | 7/2013 | Ziegler et al. |
| 8,511,031 B2 | 8/2013 | Bergelin et al. |
| 8,584,423 B2 | 11/2013 | Pervan et al. |
| 8,613,826 B2 | 12/2013 | Pervan et al. |
| 8,617,439 B2 | 12/2013 | Pervan et al. |
| 8,658,274 B2 | 2/2014 | Chen et al. |
| 8,663,785 B2 | 3/2014 | Ziegler et al. |
| 8,728,564 B2 | 5/2014 | Ziegler et al. |
| 8,756,899 B2 | 6/2014 | Nilsson et al. |
| 8,784,587 B2 | 7/2014 | Lindgren et al. |
| 8,800,150 B2 | 8/2014 | Pervan |
| 8,833,028 B2 | 9/2014 | Whispell et al. |
| 8,834,992 B2 | 9/2014 | Chen et al. |
| 8,920,874 B2 | 12/2014 | Ziegler et al. |
| 8,920,876 B2 | 12/2014 | Vetter et al. |
| 8,973,270 B2 | 3/2015 | Siebert et al. |
| 8,993,049 B2 | 3/2015 | Pervan |
| 9,085,905 B2 | 7/2015 | Persson et al. |
| 9,181,698 B2 | 11/2015 | Pervan et al. |
| 9,222,267 B2 | 12/2015 | Bergelin et al. |
| 9,249,581 B2 | 2/2016 | Nilsson et al. |
| 9,255,405 B2 | 2/2016 | Pervan et al. |
| 9,296,191 B2 | 3/2016 | Pervan et al. |
| 9,314,936 B2 | 4/2016 | Pervan |
| 9,352,499 B2 | 5/2016 | Ziegler et al. |
| 9,403,286 B2 | 8/2016 | Vetter et al. |
| 9,410,319 B2 | 8/2016 | Ziegler et al. |
| 9,410,328 B2 | 8/2016 | Pervan |
| 9,556,622 B2 | 1/2017 | Pervan et al. |
| 9,670,371 B2 | 6/2017 | Pervan et al. |
| 9,695,601 B2 | 7/2017 | Whispell et al. |
| 9,714,515 B2 | 7/2017 | Pervan |
| 9,738,095 B2 | 8/2017 | Pervan |
| 9,757,928 B2 | 9/2017 | Pervan et al. |
| 9,765,530 B2 | 9/2017 | Bergelin et al. |
| 9,783,996 B2 | 10/2017 | Pervan et al. |
| 10,017,950 B2 | 7/2018 | Pervan |
| 10,047,527 B2 | 8/2018 | Nilsson et al. |
| 10,059,084 B2 | 8/2018 | Lundblad et al. |
| 10,100,535 B2 | 10/2018 | Pervan et al. |
| 2001/0006704 A1 | 7/2001 | Chen et al. |
| 2001/0009309 A1 | 7/2001 | Taguchi et al. |
| 2001/0021431 A1 | 9/2001 | Chen |
| 2002/0031646 A1 | 3/2002 | Chen |
| 2002/0054994 A1 | 5/2002 | Dupre et al. |
| 2002/0100231 A1 | 8/2002 | Miller |
| 2002/0142135 A1 | 10/2002 | Chen et al. |
| 2002/0146568 A1 | 10/2002 | Ho et al. |
| 2002/0155297 A1 | 10/2002 | Shuren |
| 2003/0024199 A1 | 2/2003 | Pervan |
| 2003/0055145 A1 | 3/2003 | Safta et al. |
| 2003/0056873 A1 | 3/2003 | Nakos et al. |
| 2003/0059639 A1 | 3/2003 | Worsley |
| 2003/0072919 A1 | 4/2003 | Watts, Jr. et al. |
| 2003/0102094 A1 | 6/2003 | Tirri et al. |
| 2003/0129361 A1 | 7/2003 | Plug |
| 2003/0208980 A1 | 11/2003 | Miller et al. |
| 2003/0233809 A1 | 12/2003 | Pervan |
| 2004/0048044 A1 | 3/2004 | Schneider |
| 2004/0086678 A1 | 5/2004 | Chen et al. |
| 2004/0123542 A1 | 7/2004 | Grafenauer |
| 2004/0169710 A1 | 9/2004 | Ide |
| 2004/0191547 A1 | 9/2004 | Oldorff |
| 2004/0202857 A1 | 10/2004 | Singer |
| 2004/0206036 A1 | 10/2004 | Pervan |
| 2004/0237436 A1 | 12/2004 | Zuber et al. |
| 2004/0247831 A1 | 12/2004 | Nakagawa |
| 2004/0250911 A1 | 12/2004 | Vogel |
| 2005/0003099 A1 | 1/2005 | Quist |
| 2005/0003160 A1 | 1/2005 | Chen et al. |
| 2005/0079780 A1 | 4/2005 | Rowe et al. |
| 2005/0093194 A1 | 5/2005 | Oriakhi |
| 2005/0107006 A1 | 5/2005 | Makino |
| 2005/0193677 A1 | 9/2005 | Vogel |
| 2005/0210810 A1 | 9/2005 | Pervan |
| 2005/0249929 A1 | 11/2005 | Reichwein et al. |
| 2005/0252130 A1 | 11/2005 | Martensson |
| 2006/0005498 A1 | 1/2006 | Sabater et al. |
| 2006/0008630 A1 | 1/2006 | Thiers et al. |
| 2006/0024465 A1 | 2/2006 | Briere |
| 2006/0032175 A1 | 2/2006 | Chen et al. |
| 2006/0070321 A1 | 4/2006 | Au |
| 2006/0130421 A1 | 6/2006 | Nollet et al. |
| 2006/0145384 A1 | 7/2006 | Singer |
| 2006/0156672 A1 | 7/2006 | Laurent et al. |
| 2006/0182938 A1 | 8/2006 | Oldorff |
| 2006/0183853 A1 | 8/2006 | Sczepan |
| 2007/0055012 A1 | 3/2007 | Caldwell |
| 2007/0066176 A1 | 3/2007 | Wenstrup et al. |
| 2007/0159814 A1 | 7/2007 | Jacobsson |
| 2007/0166516 A1 | 7/2007 | Kim et al. |
| 2007/0175148 A1 | 8/2007 | Bergelin et al. |
| 2007/0184244 A1 | 8/2007 | Doehring |
| 2007/0196624 A1 | 8/2007 | Chen et al. |
| 2007/0207296 A1 | 9/2007 | Eisermann |
| 2007/0218260 A1 | 9/2007 | Miclo et al. |
| 2007/0224438 A1 | 9/2007 | Van Benthem et al. |
| 2007/0243359 A1 | 10/2007 | Petersen |
| 2007/0256804 A1 | 11/2007 | Garcis Espino et al. |
| 2008/0000183 A1 | 1/2008 | Bergelin et al. |
| 2008/0000188 A1 | 1/2008 | Pervan |
| 2008/0000417 A1 | 1/2008 | Pervan et al. |
| 2008/0032120 A1 | 2/2008 | Braun |
| 2008/0063844 A1 | 3/2008 | Chen et al. |
| 2008/0075882 A1 | 3/2008 | Hayata |
| 2008/0090032 A1 | 4/2008 | Perrin et al. |
| 2008/0172971 A1 | 7/2008 | Pervan |
| 2008/0176039 A1 | 7/2008 | Chen et al. |
| 2008/0256890 A1 | 10/2008 | Pervan |
| 2008/0263985 A1 | 10/2008 | Hasch et al. |
| 2008/0311355 A1 | 12/2008 | Chen et al. |
| 2009/0056257 A1 | 3/2009 | Mollinger et al. |
| 2009/0120731 A1 | 5/2009 | Thompson et al. |
| 2009/0124704 A1 | 5/2009 | Jenkins |
| 2009/0135356 A1 | 5/2009 | Ando |
| 2009/0139170 A1 | 6/2009 | Thiers |
| 2009/0145066 A1 | 6/2009 | Pervan |
| 2009/0155612 A1 | 6/2009 | Pervan et al. |
| 2009/0208646 A1 | 8/2009 | Kreuder et al. |
| 2009/0294037 A1 | 12/2009 | Oldorff |
| 2009/0311433 A1 | 12/2009 | Wittmann |
| 2010/0092731 A1 | 4/2010 | Pervan et al. |
| 2010/0152361 A1 | 6/2010 | Weaver et al. |
| 2010/0166967 A1 | 7/2010 | Chisaka |
| 2010/0196678 A1 | 8/2010 | Vermeulen |
| 2010/0223881 A1 | 9/2010 | Kalwa |
| 2010/0239820 A1 | 9/2010 | Buhlmann |
| 2010/0260962 A1 | 10/2010 | Chen et al. |
| 2010/0291397 A1 | 11/2010 | Pervan et al. |
| 2010/0300030 A1 | 12/2010 | Pervan et al. |
| 2010/0307675 A1 | 12/2010 | Buhlmann |
| 2010/0307677 A1 | 12/2010 | Buhlmann |
| 2010/0310893 A1 | 12/2010 | Derbyshire |
| 2010/0319282 A1 | 12/2010 | Ruland |
| 2010/0323187 A1 | 12/2010 | Kalwa |
| 2010/0330376 A1 | 12/2010 | Trksak |
| 2011/0041996 A1 | 2/2011 | Pervan |
| 2011/0056167 A1 | 3/2011 | Nilsson et al. |
| 2011/0131901 A1 | 6/2011 | Pervan et al. |
| 2011/0154763 A1 | 6/2011 | Bergelin et al. |
| 2011/0175251 A1 | 7/2011 | Ziegler et al. |
| 2011/0177319 A1 | 7/2011 | Ziegler et al. |
| 2011/0177354 A1 | 7/2011 | Ziegler et al. |
| 2011/0189448 A1 | 8/2011 | Lindgren et al. |
| 2011/0189471 A1 | 8/2011 | Ziegler |
| 2011/0223342 A1 | 9/2011 | Iyer et al. |
| 2011/0247748 A1 | 10/2011 | Pervan et al. |

(56) References Cited

U.S. PATENT DOCUMENTS

| | | |
|---|---|---|
| 2011/0250404 A1 | 10/2011 | Pervan et al. |
| 2011/0262720 A1 | 10/2011 | Riebel et al. |
| 2011/0283642 A1 | 11/2011 | Meirlaen et al. |
| 2011/0283650 A1 | 11/2011 | Pervan et al. |
| 2011/0287237 A1 | 11/2011 | Riebel |
| 2011/0293823 A1 | 12/2011 | Bruderer et al. |
| 2011/0293906 A1 | 12/2011 | Jacobsson |
| 2011/0300393 A1 | 12/2011 | Iio et al. |
| 2012/0003439 A1 | 1/2012 | Chen et al. |
| 2012/0040149 A1 | 2/2012 | Chen et al. |
| 2012/0137617 A1 | 6/2012 | Pervan |
| 2012/0216947 A1 | 8/2012 | Huber |
| 2012/0263878 A1 | 10/2012 | Ziegler et al. |
| 2012/0263965 A1 | 10/2012 | Persson et al. |
| 2012/0264853 A1 | 10/2012 | Ziegler et al. |
| 2012/0279154 A1 | 11/2012 | Bergelin et al. |
| 2012/0288689 A1 | 11/2012 | Hansson et al. |
| 2012/0308774 A1 | 12/2012 | Håkansson et al. |
| 2013/0014890 A1 | 1/2013 | Pervan et al. |
| 2013/0014891 A1 | 1/2013 | Vandevoorde |
| 2013/0047536 A1 | 2/2013 | Pervan |
| 2013/0052437 A1 | 2/2013 | Barth |
| 2013/0065072 A1 | 3/2013 | Pervan |
| 2013/0092314 A1 | 4/2013 | Zeigler et al. |
| 2013/0095315 A1 | 4/2013 | Pervan et al. |
| 2013/0111758 A1 | 5/2013 | Nilsson et al. |
| 2013/0111845 A1 | 5/2013 | Pervan et al. |
| 2013/0189534 A1 | 7/2013 | Pervan et al. |
| 2013/0269863 A1 | 10/2013 | Pervan et al. |
| 2013/0273244 A1 | 10/2013 | Vetter et al. |
| 2013/0273245 A1 | 10/2013 | Ziegler et al. |
| 2013/0298487 A1 | 11/2013 | Bergelin et al. |
| 2014/0017452 A1 | 1/2014 | Pervan |
| 2014/0023832 A1 | 1/2014 | Pervan |
| 2014/0033635 A1 | 2/2014 | Pervan et al. |
| 2014/0044872 A1 | 2/2014 | Pervan |
| 2014/0075874 A1 | 3/2014 | Pervan et al. |
| 2014/0115994 A1 | 5/2014 | Pervan |
| 2014/0141239 A1 | 5/2014 | Ilfrey |
| 2014/0171554 A1 | 6/2014 | Ziegler et al. |
| 2014/0178630 A1 | 6/2014 | Pervan et al. |
| 2014/0186610 A1 | 7/2014 | Pervan |
| 2014/0196618 A1 | 7/2014 | Pervan |
| 2014/0199513 A1 | 7/2014 | Pervan et al. |
| 2014/0199558 A1 | 7/2014 | Pervan et al. |
| 2014/0220318 A1 | 8/2014 | Pervan |
| 2014/0234531 A1 | 8/2014 | Ziegler et al. |
| 2014/0237924 A1 | 8/2014 | Nilsson et al. |
| 2014/0255670 A1 | 9/2014 | Kalwa |
| 2014/0283466 A1 | 9/2014 | Boo |
| 2014/0318061 A1 | 10/2014 | Pervan |
| 2014/0352248 A1 | 12/2014 | Whispell et al. |
| 2014/0356594 A1 | 12/2014 | Chen et al. |
| 2015/0017461 A1 | 1/2015 | Lindgren et al. |
| 2015/0079280 A1 | 3/2015 | Vetter et al. |
| 2015/0093502 A1 | 4/2015 | Ziegler et al. |
| 2015/0111055 A1 | 4/2015 | Persson et al. |
| 2015/0159382 A1 | 6/2015 | Pervan |
| 2015/0197942 A1 | 7/2015 | Pervan et al. |
| 2015/0197943 A1 | 7/2015 | Ziegler et al. |
| 2015/0225964 A1 | 8/2015 | Chen et al. |
| 2015/0275526 A1 | 10/2015 | Persson et al. |
| 2015/0298433 A1 | 10/2015 | Kalwa |
| 2016/0016390 A1 | 1/2016 | Lundblad et al. |
| 2016/0016391 A1 | 1/2016 | Lundblad et al. |
| 2016/0031189 A1 | 2/2016 | Pervan et al. |
| 2016/0052245 A1 | 2/2016 | Chen et al. |
| 2016/0069089 A1 | 3/2016 | Bergelin et al. |
| 2016/0082625 A1 | 3/2016 | Luukko et al. |
| 2016/0108624 A1 | 4/2016 | Nilsson et al. |
| 2016/0114495 A1 | 4/2016 | Pervan et al. |
| 2016/0194883 A1 | 7/2016 | Pervan |
| 2016/0194885 A1 | 7/2016 | Whispell et al. |
| 2016/0201324 A1 | 7/2016 | Håkansson et al. |
| 2016/0230400 A9 | 8/2016 | Pervan et al. |
| 2016/0265234 A1 | 9/2016 | Pervan |
| 2016/0368180 A1 | 12/2016 | Ziegler et al. |
| 2016/0369507 A1 | 12/2016 | Pervan |
| 2016/0375674 A1 | 12/2016 | Schulte |
| 2017/0037642 A1 | 2/2017 | Boo |
| 2017/0037645 A1 | 2/2017 | Pervan |
| 2017/0120564 A1 | 5/2017 | Schulte |
| 2017/0165936 A1 | 6/2017 | Schulte |
| 2017/0175400 A1 | 6/2017 | Joseffson et al. |
| 2017/0190156 A1 | 7/2017 | Ziegler et al. |
| 2017/0232761 A1 | 8/2017 | Pervan et al. |
| 2017/0305119 A1 | 10/2017 | Bergelin et al. |
| 2017/0348984 A1 | 12/2017 | Pervan et al. |
| 2017/0350140 A1 | 12/2017 | Bergelin et al. |
| 2018/0002934 A1 | 1/2018 | Pervan et al. |
| 2018/0094441 A1 | 4/2018 | Boo |
| 2018/0291638 A1 | 10/2018 | Pervan |

FOREIGN PATENT DOCUMENTS

| | | |
|---|---|---|
| CA | 2 557 096 A1 | 7/2005 |
| CH | 298894 A | 5/1954 |
| DE | 1 815 312 A1 | 7/1969 |
| DE | 7148789 U | 4/1972 |
| DE | 29 39 828 A1 | 4/1981 |
| DE | 33 34 921 A1 | 4/1985 |
| DE | 42 36 266 A1 | 5/1993 |
| DE | 101 56 956 A1 | 6/2003 |
| DE | 202 14 532 U1 | 2/2004 |
| DE | 103 16 886 A1 | 10/2004 |
| DE | 103 31 657 A1 | 2/2005 |
| DE | 20 2004 003 061 U1 | 7/2005 |
| DE | 10 2004 050 278 A1 | 4/2006 |
| DE | 20 2006 007 797 U1 | 8/2006 |
| DE | 10 2005 046 264 A1 | 4/2007 |
| DE | 10 2006 024 593 A1 | 12/2007 |
| DE | 10 2007 046 532 B3 | 10/2008 |
| EP | 0 129 430 A2 | 12/1984 |
| EP | 0 129 430 B1 | 1/1990 |
| EP | 0 355 829 A2 | 2/1990 |
| EP | 0 611 408 A1 | 12/1993 |
| EP | 0 592 013 A2 | 4/1994 |
| EP | 0 656 443 A1 | 6/1995 |
| EP | 0 611 408 B1 | 9/1996 |
| EP | 0 732 449 A1 | 9/1996 |
| EP | 0 744 477 A2 | 11/1996 |
| EP | 0 865 351 A1 | 9/1998 |
| EP | 0 914 914 A2 | 5/1999 |
| EP | 0 732 449 B1 | 8/1999 |
| EP | 0 744 477 B1 | 1/2000 |
| EP | 1 035 255 A1 | 9/2000 |
| EP | 1 125 971 A1 | 8/2001 |
| EP | 1 136 251 A2 | 9/2001 |
| EP | 1 193 288 A1 | 4/2002 |
| EP | 1 209 199 A1 | 5/2002 |
| EP | 1 242 702 A1 | 9/2002 |
| EP | 1 249 322 A1 | 10/2002 |
| EP | 0 865 351 B1 | 2/2003 |
| EP | 1 454 763 A2 | 9/2004 |
| EP | 1 242 702 B1 | 11/2004 |
| EP | 1 498 241 A2 | 1/2005 |
| EP | 1 507 664 A1 | 2/2005 |
| EP | 1 507 664 B1 | 2/2005 |
| EP | 1 584 378 A1 | 10/2005 |
| EP | 1 681 103 A2 | 7/2006 |
| EP | 1 690 603 A1 | 8/2006 |
| EP | 1 7847 385 A1 | 10/2007 |
| EP | 1 961 556 A1 | 8/2008 |
| EP | 1 985 464 A1 | 10/2008 |
| EP | 1 997 623 A1 | 12/2008 |
| EP | 2 025 484 A1 | 2/2009 |
| EP | 1 454 763 B1 | 8/2009 |
| EP | 2 105 320 A1 | 9/2009 |
| EP | 2 106 903 A1 | 10/2009 |
| EP | 2 123 476 A2 | 11/2009 |
| EP | 2 213 476 A1 | 8/2010 |
| EP | 2 226 201 A1 | 9/2010 |
| EP | 2 246 500 A2 | 11/2010 |
| EP | 2 263 867 A1 | 12/2010 |

(56) References Cited

FOREIGN PATENT DOCUMENTS

| | | |
|---|---|---|
| EP | 2 264 259 A2 | 12/2010 |
| EP | 2 272 667 A1 | 1/2011 |
| EP | 2 272 668 A1 | 1/2011 |
| EP | 2 305 462 A1 | 4/2011 |
| FR | 2 873 953 A1 | 2/2006 |
| GB | 984 170 A | 2/1965 |
| GB | 1090450 | 11/1967 |
| GB | 2 248 246 A | 4/1992 |
| GB | 2 262 940 A | 7/1993 |
| JP | 2-229002 A | 9/1990 |
| JP | H05-162230 A | 6/1993 |
| JP | 11-291203 A | 10/1999 |
| JP | 2001-287208 A | 10/2001 |
| JP | 2001-328210 A | 11/2001 |
| JP | 2002-001748 A | 1/2002 |
| JP | 2003-311717 A | 11/2003 |
| JP | 2003-311718 A | 11/2003 |
| JP | 2005-034815 A | 2/2005 |
| JP | 2005-074682 A | 3/2005 |
| JP | 2005-170016 A | 6/2005 |
| JP | 2005-219215 A | 8/2005 |
| JP | 3705482 B2 | 10/2005 |
| JP | 2005-307582 A | 11/2005 |
| JP | 2007-216692 A | 8/2007 |
| JP | 2007-268843 A | 10/2007 |
| JP | 2008-188826 A | 8/2008 |
| NZ | 225556 A1 | 2/1992 |
| SE | 469 326 B | 6/1993 |
| WO | WO 89/03753 A1 | 5/1989 |
| WO | WO 90/06970 A1 | 6/1990 |
| WO | WO 92/06832 A1 | 4/1992 |
| WO | WO 93/24295 A1 | 12/1993 |
| WO | WO 93/24296 A1 | 12/1993 |
| WO | WO 94/00280 A1 | 1/1994 |
| WO | WO 95/06568 A1 | 3/1995 |
| WO | WO 00/22225 A1 | 4/2000 |
| WO | WO 00/44576 A1 | 8/2000 |
| WO | WO 00/53380 A1 | 9/2000 |
| WO | WO 01/00409 A1 | 1/2001 |
| WO | WO 01/48333 A1 | 7/2001 |
| WO | WO 01/64408 A1 | 9/2001 |
| WO | WO 01/68367 A1 | 9/2001 |
| WO | WO 01/74605 A2 | 10/2001 |
| WO | WO 01/74605 A3 | 10/2001 |
| WO | WO 01/92037 A2 | 12/2001 |
| WO | WO 02/42167 A2 | 5/2002 |
| WO | WO 02/42373 A1 | 5/2002 |
| WO | WO 03/078761 A1 | 9/2003 |
| WO | WO 03/095202 A1 | 11/2003 |
| WO | WO 2004/042168 A1 | 5/2004 |
| WO | WO 2004/050359 A1 | 6/2004 |
| WO | WO 2004/067874 A2 | 8/2004 |
| WO | WO 2005/010296 A1 | 2/2005 |
| WO | WO 2005/051637 A2 | 6/2005 |
| WO | WO 2005/054600 A1 | 6/2005 |
| WO | WO 2005/066431 A2 | 7/2005 |
| WO | WO 2005/080096 A2 | 9/2005 |
| WO | WO 2005/097874 A2 | 10/2005 |
| WO | WO 2005/116337 A1 | 12/2005 |
| WO | WO 2005/116361 A1 | 12/2005 |
| WO | WO 2006/002733 A1 | 1/2006 |
| WO | WO 2006/007413 A1 | 1/2006 |
| WO | WO 2006/013469 A1 | 2/2006 |
| WO | WO 2006/015313 A2 | 2/2006 |
| WO | WO 2006/042651 A1 | 4/2006 |
| WO | WO 2006/043893 A1 | 4/2006 |
| WO | WO 2006/066776 A2 | 6/2006 |
| WO | WO 2006/126930 A1 | 11/2006 |
| WO | WO 2007/015669 A1 | 2/2007 |
| WO | WO 2007/042258 A1 | 4/2007 |
| WO | WO 2007/059294 A2 | 5/2007 |
| WO | WO 2008/004960 A2 | 1/2008 |
| WO | WO 2008/004960 A3 | 1/2008 |
| WO | WO 2008/004960 A8 | 1/2008 |
| WO | WO 2008/057390 A2 | 5/2008 |
| WO | WO 2008/057390 A3 | 5/2008 |
| WO | WO 2008/148771 A1 | 12/2008 |
| WO | WO 2009/065768 A1 | 5/2009 |
| WO | WO 2009/065769 A2 | 5/2009 |
| WO | WO 2009/065769 A3 | 5/2009 |
| WO | WO 2009/080772 A1 | 7/2009 |
| WO | WO 2009/080813 A1 | 7/2009 |
| WO | WO 2009/116926 A1 | 9/2009 |
| WO | WO 2009/124704 A1 | 10/2009 |
| WO | WO 2009/135323 A1 | 11/2009 |
| WO | WO 2010/084466 A2 | 7/2010 |
| WO | WO 2010/087752 A1 | 8/2010 |
| WO | WO 2010/094500 A1 | 8/2010 |
| WO | WO 2011/033956 A1 | 3/2011 |
| WO | WO 2011/057824 A1 | 5/2011 |
| WO | WO 2011/082491 A1 | 7/2011 |
| WO | WO 2011/087422 A1 | 7/2011 |
| WO | WO 2011/087423 A1 | 7/2011 |
| WO | WO 2011/129755 A2 | 10/2011 |
| WO | WO 2011/129757 A1 | 10/2011 |
| WO | WO 2011/141849 A2 | 11/2011 |
| WO | WO 2011/141849 A3 | 11/2011 |
| WO | WO 2011/141851 A2 | 11/2011 |
| WO | WO 2012/004699 A2 | 1/2012 |
| WO | WO 2012/018934 A1 | 2/2012 |
| WO | WO 2012/037950 A1 | 3/2012 |
| WO | WO 2012/141647 A1 | 10/2012 |

OTHER PUBLICATIONS

Extended European Search Report issued in EP 11769172.5, dated Mar. 25, 2015, European Patent Office, Munich, DE, 5 pages.

U.S. Appl. No. 15/204,474, filed Jul. 7, 2016, Georg Vetter, Jan Jacobsson, Rickard Rittinge and Hans Persson.

U.S. Appl. No. 15/204,474, Vetter et al.

Vetter, Georg, et al., U.S. Appl. No. 15/204,474 entitled "Method for Producing a Building Panel," filed in the U.S. Patent and Trademark Office Jul. 7, 2016.

U.S. Appl. No. 12/270,257, filed Nov. 13, 2008, Darko Pervan, Kent Lindgren, Jan Jacobsson, Niclas Håkansson, Eddy Boucké and Göran Ziegler, (cited herein as US Patent Application Publication No. 2009/0155612 A1 of Jun. 18, 2009).

U.S. Appl. No. 13/084,974, filed Apr. 12, 2011, Darko Pervan, (cited herein as US Patent Application Publication No. 2011/0250404 A1 of Oct. 13, 2011).

U.S. Appl. No. 13/118,846, filed May 31, 2011, Jan Jacobsson, (cited herein as US Patent Application Publication No. 2011/0293906 A1 of Dec. 1, 2011).

U.S. Appl. No. 14/089,928, filed Nov. 26, 2013, Darko Pervan, Kent Lindgren, Jan Jacobsson, Niclas Håkansson, Eddy Boucké and Göran Ziegler, (cited herein as US Patent Application Publication No. 2014/0075874 A1 of Mar. 20, 2014).

U.S. Appl. No. 14/237,617, filed Feb. 7, 2014, Darko Pervan, (cited herein as US Patent Application Publication No. 2014/0186610 A1 of Jul. 3, 2014).

U.S. Appl. No. 14/184,299, filed Feb. 19, 2014, Göran Ziegler, Kent Lindgren, (cited herein as US Patent Application Publication No. 2014/0171554 A1 of Jun. 19, 2014).

U.S. Appl. No. 14/192,169, filed Feb. 27, 2014, Darko Pervan, Kent Lindgren, Jan Jacobsson, Eddy Boucké, Göran Ziegler, Niclas Håkansson, (cited herein as US Patent Application Publication No. 2014/0178630 A1 of Jun. 26, 2014).

U.S. Appl. No. 14/321,288, filed Jul. 1, 2014, Kent Lindgren, Hans Persson and Göran Ziegler, (cited herein as US Patent Application Publication No. 2015/0017461 A1 of Jan. 15, 2015).

U.S. Appl. No. 14/553,196, filed Nov. 25, 2014, Georg Vetter, Jan Jacobsson, Rikard Rittinge and Hans Persson, (cited herein as US Patent Application Publication No. 2015/0079280 A1 of Mar. 19, 2015).

U.S. Appl. No. 14/563,167, filed Dec. 8, 2014, Göran Ziegler and Kent Lindgren, (cited herein as US Patent Application Publication No. 2015/0093502 A1 of Apr. 2, 2015).

U.S. Appl. No. 14/789,339, filed Jul. 1, 2015, Norbert Kalwa, (cited herein as US Patent Application Publication No. 2015/0298433 A1 of Oct. 22, 2015).

(56) References Cited

OTHER PUBLICATIONS

U.S. Appl. No. 14/980,638, filed Dec. 28, 2015, Darko Pervan, Jan Jacobsson, Kent Lindgren, Göran Ziegler, Niclas Håkansson and Eddy Boucké, (cited herein as US Patent Application Publication No. 2016/0114495 A1 of Apr. 28, 2016).
U.S. Appl. No. 15/162,868, filed May 24, 2016, Göran Ziegler, Marcus Bergelin, Jan Jacobsson and Melker Ryberg.
U.S. Appl. No. 14/790,774, filed Jul. 2, 2015, Christer Lundblad, Niclas Håkansson and Göran Ziegler, (Cited herein as US Patent Application Publication No. 2016/0016390 A1 of Jan. 21, 2016).
U.S. Appl. No. 14/790,850, filed Jul. 2, 2015, Christer Lundblad, Niclas Håkansson and Göran Ziegler, (Cited herein as US Patent Application Publication No. 2016/0016391 A1 of Jan. 21, 2016).
U.S. Appl. No. 14/994,593, filed Jan. 13, 2016, Niclas Håkansson, Göran Ziegler and Christer Lundblad.
U.S. Appl. No. 14/994,593, Håkansson et al.
U.S. Appl. No. 15/162,868, Pervan.
International Search Report issued in PCT/SE2011/050446, dated Dec. 7, 2011, ISA/SE Patent-och registreringsverket, Stockholm, SE, 5 pages.
Parquet International, "Digital Printing is still an expensive process," Mar. 2008, cover page/pp. 78-79, www.parkettmaqazin.com.
Floor Daily, "Shaw Laminates: Green by Design," Aug. 13, 2007, 1 pg, Dalton, GA.
BTLSR Toledo, Inc. website. http://www.btlresins.com/more.html. "Advantages to Using Powdered Resins," May 26, 2007, 2 pages, per the Internet Archive WayBackMachine.
Nimz, H.H., "Wood," Ullmann's Encyclopedia of Industrial Chemistry, published online Jun. 15, 2000, pp. 453-505, vol. 39, Wiley-VCH Verlag GmbH & Co. KgaA, Weinheim, DE.
Le Fur, X., et al., "Recycling melamine-impregnated paper waste as board adhesives," published online Oct. 26, 2004, pp. 419-423, vol. 62, Springer-Verlag, DE.

Odian, George, "Principles of Polymerization," 1991, $3^{rd}$ Edition, 5 pages incl. pp. 122-123, John Wiley & Sons, Inc., New York, NY, USA.
"Hex Netting—Fencing—Ace Hardware," from http://www.acehardware.com/family/index.jsp?categoryId=1260278, archived on Nov. 1, 2009, accessed through the Internet Archive, WaybackMachine, 3 pages.
Engstrand, Ola (Contact)/Valinge Innovation, Technical Disclosure entitled "Fibre Based Panels With a Wear Resistance Surface," Nov. 17, 2008, IP.com No. IPCOM000176590D, IP.com PriorArtDatabase, 76 pages.
Engstrand, Ola (Contact)/Valinge Innovation, Technical Disclosure entitled "WFF Embossing," May 15, 2009, IP.com No. IPCOM000183105D, IP.com PriorArtDatabase, 36 pages.
Sichuan Jieyang Building Materials Co., Ltd., "PVC Flooring Planks With Good Quality," China PVC Flooring; 3 pages, http://harjorflooring.en.made-in-china.com/product/vXFxYDICrnks/China-PVC-Flooring-Planks-with-Good-Quality.html, 2013.
Håkansson, Niclas, et al., U.S. Appl. No. 14/994,593 entitled "Method to Produce a Wear Resistant Layer with Different Gloss Levels," filed in the U.S. Patent and Trademark Office Jan. 13, 2016.
Pervan, Darko, et al., U.S. Appl. No. 15/162,868 entitled "Method of manufacturing a Layer," filed in the U.S. Patent and Trademark Office May 24, 2016.
U.S. Appl. No. 16/113,333, filed Aug. 27, 2018, Christer Lundblad, Niclas Håkansson and Göran Ziegler.
U.S. Appl. No. 16/113,333, Lundblad, et al.
Extended European Search Report issued in EP 18160127.9, dated Jun. 22, 2018, European Patent Office, Munich, DE, 6 pages.
Lundbland, Christer, et al., U.S. Appl. No. 16/113,333 entitled "Method to Produce a Thermoplastic Wear Resistant Foil," filed in the U.S. Patent and Trademark Office Aug. 27, 2018.

* cited by examiner

POWDER OVERLAY

CROSS REFERENCE TO RELATED APPLICATIONS

The present application is a continuation of U.S. application Ser. No. 13/912,587, filed on Jun. 7, 2013, which is a continuation of U.S. application Ser. No. 13/084,955, filed on Apr. 12, 2011, now U.S. Pat. No. 8,480,841, issued Jul. 9, 2013, which claims the benefit of U.S. Provisional Application No. 61/323,463, filed on Apr. 13, 2010. The entire contents of U.S. application Ser. No. 13/912,587, U.S. application Ser. No. 13/084,955 and U.S. Provisional Application No. 61/323,463 are hereby incorporated herein by reference.

TECHNICAL FIELD

The disclosure generally relates to the field of fibre-based panels with wear resistant surfaces for building panels, preferably floor panels. The disclosure relates to building panels with such wear resistance surface and to production methods to produce such panels.

FIELD OF APPLICATION

Embodiments of the present invention are particularly suitable for use in floating floors, which are formed of floor panels with a wood fibre core and a decorative wear resistant surface. The following description of technique, problems of known systems and objects and features of the invention will therefore, as a non-restrictive example, be aimed above all at this field of application and in particular at floorings which are similar to traditional floating wood fibre based laminate floorings. Embodiments of the invention do not exclude floors that are glued down to a sub floor.

It should be emphasized that embodiments of the invention can be used as a panel or as a surface layer, which is for example glued to a core. The disclosure can also be used in applications as for example wall panels, ceilings, and furniture components and similar. It could also be used in floorings with optional surface materials such as cork or wood, in order to improve wear and design properties.

BACKGROUND

Wood fibre based direct pressed laminated flooring usually comprises a core of a 6-12 mm fibre board, a 0.2 mm thick upper decorative surface layer of laminate and a 0.1-0.2 mm thick lower balancing layer of laminate, plastic, paper or like material.

A laminate surface generally comprise two paper sheets, a 0.1 mm thick printed decorative paper and a transparent 0.05-0.1 mm thick overlay paper applied over the decorative paper and intended to protect the decorative paper from abrasion. The print on the decorative non-transparent paper is only some 0.01 mm thick. The transparent overlay, which is made of refined fibres (e.g. a-cellulose fibres), comprises small hard and transparent aluminum oxide particles. The refined fibres are rather long, about 2-5 mm and this gives the overlay paper the required strength. In order to obtain the transparency, all natural resins that are present in the virgin wood fibres, have been removed and the aluminum oxide particles are applies as a very thin layer over the decorative paper. The surface layer of a laminate floor is characterized in that the decorative and wear properties are generally obtained with two separate layers one over the other.

The printed decorative paper and the overlay are impregnated with melamine resin and laminated to a wood fibre based core under heat and pressure.

The small aluminum oxide particles could have a size in the range of 20-100 microns. The particles could be incorporated in the surface layer in several ways. For example they could be incorporated in the pulp during the manufacturing of the overlay paper. They could also be sprinkled on the wet lacquer during impregnation procedure of the overlay or incorporated in the lacquer used for impregnation of the overlay.

The wear layer could also be produced without a cellulose overlay. In such a case melamine resin and aluminum oxide particles are applied as a lacquered layer directly on the decorative paper with similar methods as described above. Such a wear layer is generally referred to as liquid overlay.

With this production method a very wear resistant surface could be obtained and this type of surface is mainly used in laminate floorings but it could also be used in furniture components and similar applications. High quality laminate floorings have a wear resistance of 4000-6000 revolutions, which corresponds to the abrasion classes AC4 and AC5 measured with a Taber Abraser according to ISO-standard.

It is also known that the wear resistance of a lacquered wood surface could be improved considerably by incorporating aluminum oxide particles in the transparent lacquer covering the wood surface.

The most common core material used in laminate floorings is fibreboard with high density and good stability usually called HDF—High Density Fibreboard. Sometimes also MDF—Medium Density Fibreboard—is used as core. Other core materials such as particleboard are also used.

Recently new "paper free" floor types have been developed where powder technology is used to obtain a solid laminate surface comprises a substantially homogenous mix of non-processed wood fibres, binders and wear resistant particles. Such floor types are below referred to as "solid laminate" floors. The wear resistant particles are preferably aluminum oxide particles and the binders are preferably thermosetting resins such as melamine. Other suitable materials are for example silica or silicon carbide. In general all these materials are preferably applied in dry form as a mixed powder on a HDF core and cured under heat and pressure to a 0.2-1.0 mm solid (opaque) laminate layer. The solid layer in solid laminate floors provides high impact and wears resistance.

Powder technology is also used to produce floors with a surface that combines the paper technology and powder technology. Such floor types are below referred to as "wood powder laminate floors" A decorative paper is applied on a sub layer comprising wood powder and binders. The decorative paper is protected by a conventional overlay. The main advantages with such floors are that deep embossing and improved impact resistance could be obtained.

The wear resistance in wood powder laminate floors is generally not sufficient when surfaces with deep embossing is formed since the protruding parts at the surface are subject to high wear. Even some solid laminate floor with several thin layers comprising different colours suffer from a low wear resistance.

It would be a great advantage if wear resistance could be improved in a cost efficient way. The above description of various known aspects is the applicants' characterization of such, and is not an admission that any of the above description is prior art.

Definition of Some Terms

In the following text, the visible surface of the installed floor panel is called "front side", while the opposite side of the floor panel, facing the sub floor, is called "rear side". The sheet-shaped material that comprises the major part of a panel and provides the panel with the required stability is called "core". When the core is coated with a surface layer closest to the front side and preferably also a balancing layer closest to the rear side, it forms a semi-manufacture, which is called "floor board" or "floor element" in the case where the semi-manufacture, in a subsequent operation, is divided into a plurality of floor elements. When the floor elements are machined along their edges so as to obtain their final shape with the joint system, they are called "floor panels". By "surface layer" are meant all layers which give the panel its decorative properties and its wear resistance and which are applied to the core closest to the front side covering preferably the entire front side of the floorboard. By "decorative surface layer" is meant a layer, which is mainly intended to give the floor its decorative appearance. "Wear layer" relates to a layer, which is mainly adapted to improve the durability of the front side.

By "horizontal plane" is meant a plane, which extends parallel to the outer part of the surface layer. By "horizontally" is meant parallel to the horizontal plane and by "vertically" is meant perpendicularly to the horizontal plane. By "up" is meant towards the front side and by "down" towards the rear side.

By processed wood fibres are meant wood fibres that are processed, e.g. by removing natural resins such as lignin, such that they are transparent in a cured binder.

Known Technique and Problems thereof

In laminate floors the wear and abrasion resistance is typically provided by aluminum oxide containing overlay papers that are impregnated and/or coated as for example described in US 2009/0208646 A1. It also known to provide an overlay by applying a liquid layer of a resin e.g. a melamine resin into which aluminum oxide is applied. This type may also be reinforced by adding e.g. a cellulosic flock in liquid layer. It is also known to produce an overlay paper by adding the aluminum oxide in the paper production process.

The application of such an overlay paper or liquid layers is complicated and costly and it would be an advantage if the production method could be simplified. In addition, in deeply embossed products the wear properties are limited since the protruding parts of the surface are subjected to a higher stress than would be the case for more moderately embossed surfaces.

The recently developed class of paper free laminate floors can typically be made with superior wear properties, but in certain formulations superficial design elements, prints or other effects could need a surface protection exceeding what could be achieved through the normal formulation.

It is known that dry and wet overlays, which are produced by production methods where for example thermosetting resins in dry or wet form are mixed with aluminum oxide, without any fibres could also be used. Aluminum oxide particles mixed with melamine resin powder could for example be applied on a wood veneer prior to pressing and a wear resistant surface could be obtained without any surface coating after pressing. Such a production method does not give sufficient wear properties.

OBJECTS AND SUMMARY

An objective of certain embodiments of the invention is to provide a building panel, preferably a floor panel with a transparent wear resistant layer, which could be produced in a more cost effective way than with the present know technology.

A second objective of certain embodiments is to provide a building panel, preferably a floor panel with a transparent wear resistant layer which can be used to make deeply embossed floor products with higher wear resistance than possible with presently known technology.

A third objective of certain embodiments is to provide a building panel, preferably a floor panel with a transparent wear resistant layer which allows for making floors having a better worn surface appearance.

A fourth objective of certain embodiments is to provide a formulation suited for application with scattering machines that can yield any or all of the objectives stated above.

The embodiments of the invention are not limited to the above objectives.

An aspect of the invention is a production method to produce a building panel with decorative surface layer with a transparent wear resistant surface layer comprising the steps below and preferably in the indicated sequence:
  applying a decorative layer on a carrier;
  applying a dry powder layer comprising a mix of processed wood fibres, binder and wear resistant particles on the decorative layer; and
  curing the mix by applying heat and pressure to obtain a decorative surface layer comprising a transparent wear resistant layer.

The powder is easy to handle and provides a cost efficient production method. The processed wood fibres provide, together with the cured binder, a reinforced matrix for the wear resistant particles which are essentially homogenously distributed throughout the thickness of the cured layer. This matrix prevents the wear resistant particles from coming off during wear of the surface layer and combined with the essentially homogenously distribution a significant increased wear resistance is achieved.

In an embodiment, the powder mix may comprise processed wood fibres in the range of about 1% to about 50%, preferably about 20%, by weight of the powder mix, binder in the range of about 50% to about 90%, preferably about 70%, by weight of the powder mix, and wear resistant particles in the range of about 0% to about 15%, preferably about 10%, by weight of the powder mix.

The curing is preferably performed by applying the heat and pressure by, for example, press plates, during about 5-200 seconds, preferably during 5-30 seconds. The heat applied may be in the range of about 140° C. to about 200° C., preferably in the range about 160 to about 180° C. The pressure applied is in the range of about 20 to about 60 kg/cm$^2$, preferably about 40 kg/cm$^2$.

The binder is preferably melamine formaldehyde resin and the wear resistant particles are preferably aluminum oxide or silica. The wear resistant layer is according to one preferred embodiment pressed with an embossed matrix that forms protruding parts on the surface.

The dry powder comprises according to one embodiment processed wood fibres that are essentially all small individual fibres which may be smaller than about 1.0 mm, preferably smaller than 0.5 mm. The small fibres are preferably not bonded to each other as for example long fibres in paper layers and a HDF core, and can be compressed, formed and displaced in all direction during the initial part of a pressing operation until the binder cures. The uncured transparent wear layer preferably behaves similar to a paste or a liquid substance and floats during the initial part of the curing stage.

The fibre size may be measured in different ways:
an actual individual fibre could be measured in diameter and length; or
a fibre size could be defined by the size of the mesh of the net in the sieve in which the fibres are separated by size and the wanted fraction is sorted out.

For refined fibres used in a wood fibre floor produced from an HDF-board the typical production steps are:
bringing down the HDF-boards to flakes in a pre-mill;
bringing down the flakes to the wanted size in a hammer mill; and
sieving the fibres in a net with a mesh size of 0.3 mm.

Often such fibres are defined to be less than 0.3 mm in size. The diameter could though of course be less and the length could be longer due to the elongated shape of the fibre.

The distribution of the fibre sizes after sieving could be defined by measurements of the fibres.

For processed fibres (for example, bleached fibres) the mesh size used is often smaller than the one for refined fibres. The size of the fibres is defined by the distribution of the sieved material. A typical distribution of fibres size is:
>32 µm 43.6%;
>90 µm 9.3%; and
>160 µm 0.4%.

The powder mix and the curing can be adapted such that a larger amount of wear resistant and transparent material is located in the upper parts of the protruding surface portions than on the lower and more compressed portions. This will give a higher wear resistance in the parts that are subject to the highest wear.

The decorative layer may include, for example, paper. The paper may be a printed melamine impregnated paper, for example, a décor sheet composed of melamine resin impregnated cellulose fibres. The paper may be placed directly on the carrier, for example, an HDF board. The paper may be placed on a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres.

The decorative layer may include, for example, a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres. The decorative layer may include, for example, multiple layers of scattered decorative powder mix.

The decorative layer may include, for example, a wood veneer. The wood veneer may be placed directly on the carrier, for example, an HDF board. The wood veneer may be placed on a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres.

The decorative layer may include, for example, cork. The cork may be placed directly on the carrier, for example, an HDF board. The cork may be placed on a scattering of decorative powder mix. For example, the decorative powder may include wood fibres and a binder, and optionally, a pigment and/or wear resistant particles. The wood fibres of the decorative power may be processed wood fibres or unprocessed wood fibres, such as recycled wood fibres.

A second aspect of the invention is a method of manufacturing a building panel, wherein the method comprises the steps of:
applying a decorative layer on a carrier;
applying a dry powder layer comprising a mix of a thermoplastic material and wear resistant particles on the decorative layer; and
applying heat and pressure on the powder layer to obtain a decorative surface layer comprising a transparent wear resistant layer.

The wear resistant particles may comprise aluminum oxide and/or silica. The mix may include processed wood fibres.

A third aspect of the invention is a method of manufacturing a building panel, wherein the method comprises the steps of:
applying a dry powder layer comprising a mix of processed wood fibres, binder and wear resistant particles directly on a wood panel; and
applying heat and pressure on the powder layer to obtain a transparent wear resistant layer.

The resulting product is, for example, a clear and glossy wood product having excellent chemical and abrasion resistance.

The wear resistant particles may comprise aluminum oxide and/or silica. The binder may comprise a thermoplastic material.

The thermoplastic material in the second and third aspect may be transparent material such as vinyl particles. Several plastic materials in powder form can be used such as E-PVC, S-PVC, PVA, PET, PS, SAN, PMMA and similar.

The plastic powder should preferably have a glass transition temperature below the intended processing temperature and a melting point higher than the intended processing temperature. The plastic can further comprise functional groups such as hydroxy-, carboxy- and amino functionalities. Blends of plastics can also be used.

BRIEF DESCRIPTION OF THE DRAWINGS

The invention will in the following be described in connection to preferred embodiments and in greater detail with reference to the appended exemplary drawings, wherein.

DETAILED DESCRIPTION OF EMBODIMENTS

A laminate floor having good mechanical wear properties are made from the application of heat and pressure to layers of various types of sheets of papers over which a powder layer is scattered. The sheets are positioned over a core, such as a medium or high density fibre board. Under the core one or more sheets of paper can be positioned. The sheets are made using standard papermaking techniques and chemistry and are typically impregnated using standard impregnation techniques and chemistry. In an embodiment the powder layer is composed of a homogenous mixture of powder resin, fibres and hard particles. The powder resin is preferably a thermoset resin such as amino resin or a mixture of such resins. A preferred resin is melamine formaldehyde resin. The fibres are preferably transparent such as processed wood fibres but also other transparent fibres such as glass fibres can be used. Fibres having limited transparency such as various inorganic fibres, metal fibres or unprocessed wood fibres can be used but would not yield the desired transparency of the protective layer. Preferred hard particles to yield the final good mechanical wear properties include aluminum oxide, silicon oxide and mixtures thereof. The use of heat and pressure convert the layers of sheets and the scattered powder layer into a laminate.

Figure 1:
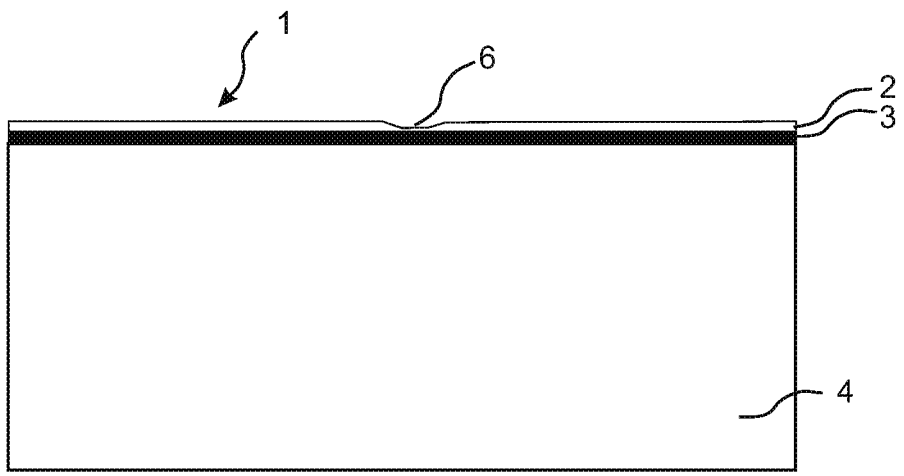
FIG. 1 illustrates a conventional laminate floor panel with an embossed portion.

A typical laminate floor (FIG. 1) is composed from top and bottom with the following layers: (2) an overlay sheet composed of melamine resin impregnated cellulose fibres in which abrasive particles are incorporated, (3) a décor sheet composed of melamine resin impregnated cellulose fibres, (4) a core material such as high density fibre board. A balancing sheet composed of melamine resin impregnated cellulose fibres is typically used on the backside of the panel. A laminate floor typically has embossed portions (6) extending below the main surface (1). If the embossed portions extend to far from the main surface poor surface appearance can occur due to the limitation of the impregnated papers.

Figure 2:
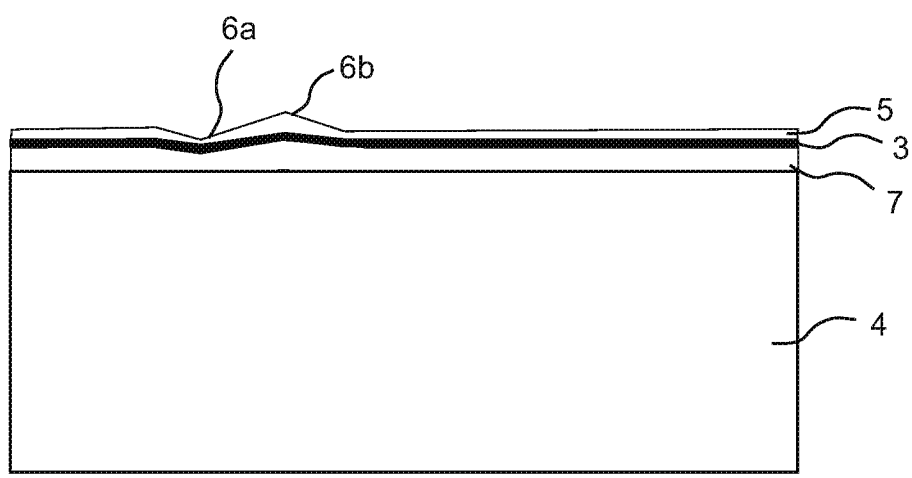
FIG. 2 illustrates an improved laminate floor with embossed portions.

An improved laminate floor (FIG. 2) according to one non-restrictive embodiment of the invention comprises from top to bottom the following layers: (5) a protective powder layer, powder overlay, composed of melamine resin powder, processed wood fibres and abrasive particles, (3) a décor sheet composed of melamine resin impregnated cellulose fibres, (7) an optional powder layer comprising of melamine resin powder and processed wood fibres, (4) a core material such as high density fibre board. A balancing sheet composed of melamine resin impregnated cellulose fibres is typically used. Since the protective powder layer does not have a restricted movement in neither horizontal nor vertical directions embossed potions can be found both below (6a) and above (6b) the main surface (1). The resulting products have a higher amount of the protective melamine resins and aluminum oxide particles in the protruding surface portion (6b) giving an improved wear resistance compared to what is found with conventional overlays.

The impregnation of overlay papers are typically made in impregnation lines such as for example described in US 2009/0208646 A1. Such impregnation lines require investments and handling of impregnation fluids that typically have limited shelf life. Such a process could be improved by the use of a powder overlay.

Example 1: Direct Laminate Product Having a Conventional Overlay (Comparative Example)

A laminate product comprising a HDF carrier board, a balancing paper, a printed melamine impregnated paper and an overlay was pressed in a short cycle press using a force of 40 kg/cm$^2$ for 25 seconds at a surface temperature of 160° C. The press plate was a virtually smooth glossy plate.

The resulting product was a laminated surface having an abrasion resistance exceeding the demands for AC3 according to the test method in EN13329:2006 (E) with a good surface appearance.

Example 2: Deeply Embossed Laminate Product Having a Conventional Overlay (Comparative Example)

A laminate product comprising a HDF carrier board, a balancing paper, a printed melamine impregnated paper and an overlay was pressed in a short cycle press using a force of 40 kg/cm$^2$ for 25 seconds at a surface temperature of 160° C. The press plate was a deeply structured plate with parts having 0.7 mm depth.

The resulting product was a laminated surface having an abrasion resistance failing the demands for AC2 according to the test method in EN13329:2006 (E). In addition the surface appearance was not good enough since the paper sheets of the laminate cracked at the large embossings.

Example 3: Deeply Embossed Direct Laminate Product Having a Protective Layer Made with Regular Fibres (Comparative Example)

A laminate product comprising a HDF carrier board, a balancing paper, a printed melamine impregnated paper and 300 g/m$^2$ of a protective layer comprising a homogenous mixture of recycled fibres that have not been processed, melamine powder resins and aluminum oxide particles was pressed in a short cycle press using a force of 40 kg/cm$^2$ for 25 seconds at a surface temperature of 160° C. The press plate was a virtually smooth press plate.

The resulting product was a laminated surface having an abrasion resistance passing the demands for AC6 according to the test method in EN13329:2006 (E). The surface appearance was not good enough since the fibres in the protective layer were visible.

Example 4

Deeply embossed direct laminate having a protective Layer as per an embodiment of the disclosure.

A laminate product comprising a HDF carrier board, a balancing paper positioned under the HDF, 1000 g/m$^2$ of a scattered sub layer comprising a homogenous mixture of recycled fibres and amino resins, scattered over the HDF, a melamine resins impregnated printed paper positioned over the scatted sub layer and 300 g/m$^2$ of a protective layer comprising a homogenous mixture of processed fibres, melamine powder resins and aluminum oxide particles, scattered over the printed melamine impregnated paper, was pressed in a short cycle press using a force of 40 kg/cm$^2$ for 25 seconds at a surface temperature of 160° C. The press plate was a deeply structured plate with parts having 0.7 mm depth.

The resulting product was a laminated surface having an abrasion resistance passing the demands for AC3 according to the test method in EN13329:2006 (E). The surface appearance was good enough since the fibres in the protective layer was not visible and no cracks of overlay paper were found in the deep embossed parts of the surface.

Example 5: Deeply Embossed Paper Free Building Panel Having a Protective Layer as Per an Embodiment of the Disclosure 150 g/m$^2$ of a protective layer comprising a homogenous mixture of processed fibres, melamine powder resins and aluminum oxide particles, scattered over 150 g/m$^2$ of a decorative layer comprising a homogenous mixture of processed fibres, melamine powder resins, pigment particles and aluminum oxide particles, scattered over 500 g/m$^2$ of a second decorative layer comprising a homogenous mixture of processed fibres, melamine powder resins, pigment particles and aluminum oxide particles was pressed in a short cycle press using a force of 40 kg/cm$^2$ for 25 seconds at a surface temperature of 160° C. The press plate was a deeply structured plate with parts having 0.7 mm depth.

The resulting product was a deeply structured paper free laminate having an abrasion resistance passing the demands for AC6 according to the test method in EN13329:2006 (E).

The initial surface appearance was excellent since the protective layer protects the surface from micro scratches that typically give products an early worn appearance.

Example 6: Wood Panel Having a Protective Layer as Per an Embodiment of the Disclosure A sanded wood panel was scattered with 150 g/m$^2$ of a protective layer comprising a homogenous mixture of processed fibres, melamine powder resins and aluminum oxide particles. The product was compressed at 20 bars for 30 seconds at 160° C. using a smooth glossy press plate.

The resulting product was a clear glossy wood product having excellent chemical and abrasion resistance.

The invention claimed is:

1. A method of manufacturing a building panel, wherein the method comprises the steps of:
 applying a first layer on a carrier;
 applying a dry powder layer, comprising a binder and wear resistant particles, on the first layer, the binder being a thermosetting resin in dry powder form; and
 applying heat and pressure on the dry powder layer to obtain a transparent wear resistant layer.

2. The method according to claim 1, wherein the wear resistant particles comprise aluminium oxide and/or silica.

3. The method according to claim 1, wherein the dry powder layer further comprises processed wood fibres.

4. The method according to claim 1, wherein the first layer is a decorative layer.

5. The method according to claim 4, wherein the decorative layer is a printed paper.

6. The method according to claim 4, wherein the decorative layer is wood veneer.

7. The method according to claim 4, wherein the decorative layer is a paper.

8. The method according to claim 4, wherein the decorative layeris a scattering of decorative mix.

9. The method according to claim 4, wherein the decorative layer is cork.

10. The method as claimed in claim 1, wherein the carrier is a wood based board.

11. The method as claimed in claim 1, wherein the carrier is an HDF or MDF board.

12. The method as claimed in claim 1, wherein the pressings step comprises pressing the dry powder layer against an embossed matrix.

13. The method as claimed in claim 12, wherein the pressing against the embossed matrix creates an embossing depth that exceeds the combined thickness of the first layer and the transparent wear layer.

14. The method as claimed in claim 1, wherein the first layer is applied on the carrier before the dry powder layer is applied on the first layer.

15. A method of manufacturing a building panel, wherein the method comprises the steps of:
 applying a first layer on a carrier;
 applying a dry powder layer, comprising a binder and wear resistant particles, on the first layer; and
 applying pressure on the dry powder layer to form the dry powder layer into a transparent wear resistant layer so that the building panel is manufactured comprised of the carrier, the first layer on the carrier, and the transparent wear resistant layer on the first layer.

* * * * *

UNITED STATES PATENT AND TRADEMARK OFFICE
CERTIFICATE OF CORRECTION

PATENT NO. : 10,344,379 B2
APPLICATION NO. : 15/061303
DATED : July 9, 2019
INVENTOR(S) : Darko Pervan et al.

It is certified that error appears in the above-identified patent and that said Letters Patent is hereby corrected as shown below:

In the Claims

Column 10, Line 4, Claim 8:
"layeris"

Should read:
-- layer is --

Signed and Sealed this
Twenty-third Day of April, 2024

Katherine Kelly Vidal
*Director of the United States Patent and Trademark Office*